(12) United States Patent
Chik et al.

(10) Patent No.: US 10,396,554 B2
(45) Date of Patent: Aug. 27, 2019

(54) POWER DISTRIBUTION CONTROL WITHIN A MODULAR CONVERTER SYSTEM USING EFFICIENCY CALCULATIONS

(71) Applicant: THE BOEING COMPANY, Chicago, IL (US)

(72) Inventors: Mun Shin Chik, St. Louis, MO (US); Lijun Gao, Renton, WA (US); Shengyi Liu, Sammamish, WA (US)

(73) Assignee: THE BOEING COMPANY, Chicago, IL (US)

( * ) Notice: Subject to any disclaimer, the term of this patent is extended or adjusted under 35 U.S.C. 154(b) by 338 days.

(21) Appl. No.: 15/431,376

(22) Filed: Feb. 13, 2017

(65) Prior Publication Data

US 2018/0233908 A1  Aug. 16, 2018

(51) Int. Cl.
*H02J 3/38* (2006.01)
*H02J 3/00* (2006.01)
*H02M 7/44* (2006.01)
*G01R 21/133* (2006.01)
*H02J 3/48* (2006.01)

(52) U.S. Cl.
CPC .............. *H02J 3/00* (2013.01); *G01R 21/133* (2013.01); *H02J 3/38* (2013.01); *H02J 3/381* (2013.01); *H02J 3/48* (2013.01); *H02M 7/44* (2013.01); *B64D 2221/00* (2013.01)

(58) Field of Classification Search
CPC ........ H02J 3/00; H02J 3/48; H02J 3/38; H02J 3/381; G01R 21/133; H02M 7/44; B64D 2221/00
See application file for complete search history.

(56) References Cited

U.S. PATENT DOCUMENTS 9,209,721 B2  12/2015  Solodovnik et al.
2010/0109442 A1*  5/2010  Vega Betoret .......... H02J 3/383
307/82

(Continued)

FOREIGN PATENT DOCUMENTS

EP         0409226 A2    1/1991
WO    WO-9808288 A1 *  2/1998  ................ H02J 3/38

OTHER PUBLICATIONS

European Search Report for Application No. 17204033.9-1204 dated Jun. 25, 2018.

*Primary Examiner* — Daniel J Cavallari
(74) *Attorney, Agent, or Firm* — Patterson + Sheridan, LLP

(57) ABSTRACT

A method is disclosed for controlling power distribution from a plurality of inverters to one or more loads. The method comprises determining, using one or more computer processors, a plurality of possible combinations of the plurality of inverters to meet load demands corresponding to the one or more loads. Each possible combination of the plurality of possible combinations includes a respective set of one or more inverters of the plurality of inverters. The method further comprises accessing, from a memory coupled with the one or more computer processors, one or more predefined efficiency functions associated with the one or more inverters; selecting, based on the one or more predefined efficiency functions, a combination from the plurality of possible combinations; and transmitting control signals to the set of one or more inverters corresponding to the selected combination to thereby power the one or more loads.

20 Claims, 6 Drawing Sheets

(56) References Cited

U.S. PATENT DOCUMENTS

| | | |
|---|---|---|
| 2010/0274407 A1 | 10/2010 | Creed |
| 2012/0232728 A1 | 9/2012 | Karimi et al. |
| 2015/0022245 A1 | 1/2015 | Gao et al. |
| 2016/0094039 A1 | 3/2016 | Winstanley et al. |
| 2018/0097360 A1* | 4/2018 | Batten ........................ H02J 1/08 |
| 2018/0097452 A1* | 4/2018 | Chapman ................ H02S 40/32 |

* cited by examiner

POWER DISTRIBUTION CONTROL WITHIN A MODULAR CONVERTER SYSTEM USING EFFICIENCY CALCULATIONS

FIELD

The present disclosure relates generally to power management, and more specifically, to controlling power distribution from a plurality of parallel inverters within a modular converter architecture using efficiency calculations.

BACKGROUND

Modern vehicles such as aircraft use a large number of electronics, motors, heaters, and other electrically-driven equipment. Electric motors, in particular, are ubiquitous in modern vehicles and drive everything from hydraulic pumps to cabin fans. Conventionally, each of these electric motors is driven by an independent motor controller. Each motor controller is sized to be able to carry the maximum amount of current required to power its respective motor at full power for an extended period of time (and generally, further includes some additional capacity for safety) without overheating or malfunctioning.

As a result, an aircraft carries a number of motor controllers, each of which is typically oversized and underutilized a majority of the time. In other words, the motor controller includes enough capacity to run the motor at full power for an extended period of time plus a safety margin, but motors are rarely, if ever, run at full capacity. This is because the motors themselves have some safety margin built in and because, a majority of the time, the motors are operating in a lower demand regime (e.g., the cabin fan is not always on "High"). In addition, some motors are only used occasionally, or during specific flight segments, and are unused the remainder of the time. As a result, many of an aircraft's complement of heavy, expensive motor controllers spend a majority of their service life either inactive or operating significantly below their rated power outputs.

To better utilize motor controller capacity, a modular converter system can provide multiple, modular, assignable, dynamically reconfigurable motor controllers that can work alone or in parallel with other parallel motor controllers to meet power control needs. The converter system connects one or more controllers, connected in parallel, to each active electrical load in the aircraft, as necessary, to meet existing power demands. Increasing utilization of motor controllers can provide a corresponding reduction in system weight and cost.

During operation of the modular converter system, a plurality of inverters can be operated in parallel to power an electric motor or another electrical load. Conventionally, the number of parallel inverters used to drive a particular electrical load is based solely on the power demand of the electrical load and the rated power of the inverters, but does not consider the efficiency of each inverter within such a parallel arrangement. For example, based on the power contribution of each parallel inverter to collectively meet the power demand, one or more of the parallel inverters may be operated at less than the maximum efficiency of the inverter, which tends to increase energy and cost requirements.

SUMMARY

One embodiment provides a method of controlling power distribution from a plurality of inverters to one or more loads. The method comprises determining, using one or more computer processors, a plurality of possible combinations of the plurality of inverters to meet load demands corresponding to the one or more loads. Each possible combination of the plurality of possible combinations includes a respective set of one or more inverters of the plurality of inverters. The method further comprises accessing, from a memory coupled with the one or more computer processors, one or more predefined efficiency functions associated with the one or more inverters, and selecting, based on the one or more predefined efficiency functions, a combination from the plurality of possible combinations. The method further comprises transmitting control signals to the set of one or more inverters corresponding to the selected combination to thereby power the one or more loads.

Another embodiment provides a power distribution system for powering one or more loads. The power distribution system comprises a plurality of inverters and a controller comprising one or more computer processors. The controller is configured to determine a plurality of possible combinations of the plurality of inverters to meet load demands corresponding to the one or more loads. Each possible combination of the plurality of possible combinations includes a respective set of one or more inverters of the plurality of inverters. The controller is further configured to access, from a memory coupled with the one or more computer processors, one or more predefined efficiency functions associated with the one or more inverters, and select, based on the one or more predefined efficiency functions, a combination from the plurality of possible combinations. The controller is further configured to transmit control signals to the set of one or more inverters corresponding to the selected combination to thereby power the one or more loads.

Another embodiment provides a method of controlling power distribution from a plurality of inverters to one or more loads. The method comprises determining, using one or more computer processors, a plurality of possible combinations of the plurality of inverters to meet load demands corresponding to the one or more loads. Each possible combination of the plurality of possible combinations includes a respective set of one or more inverters of the plurality of inverters. The method further comprises accessing, from a memory coupled with the one or more computer processors, one or more predefined efficiency functions associated with the one or more inverters, and assigning, for each possible combination of the plurality of possible combinations, a respective priority based on a composite efficiency of the one or more inverters of the respective set. The method further comprises selecting a combination from the plurality of possible combinations based on the respective priority, and transmitting control signals to the set of one or more inverters corresponding to the selected combination to thereby power the one or more loads.

The features, functions, and advantages that have been discussed may be achieved independently in various embodiments or may be combined in yet other embodiments, further details of which can be seen with reference to the following description and drawings.

BRIEF DESCRIPTION OF ILLUSTRATIONS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 illustrates an exemplary modular converter system, according to one embodiment.

Figure 5:
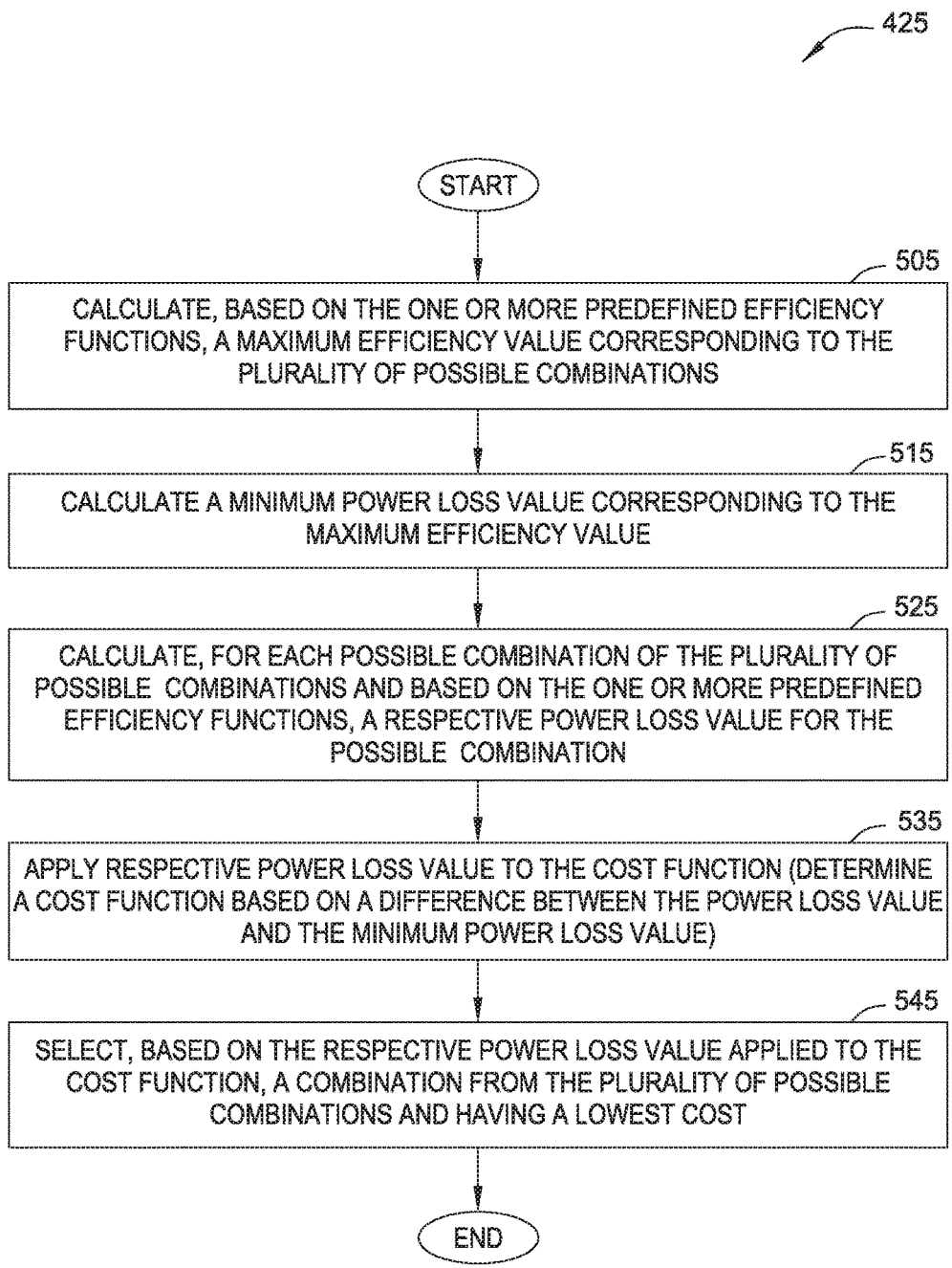
Figure 6:
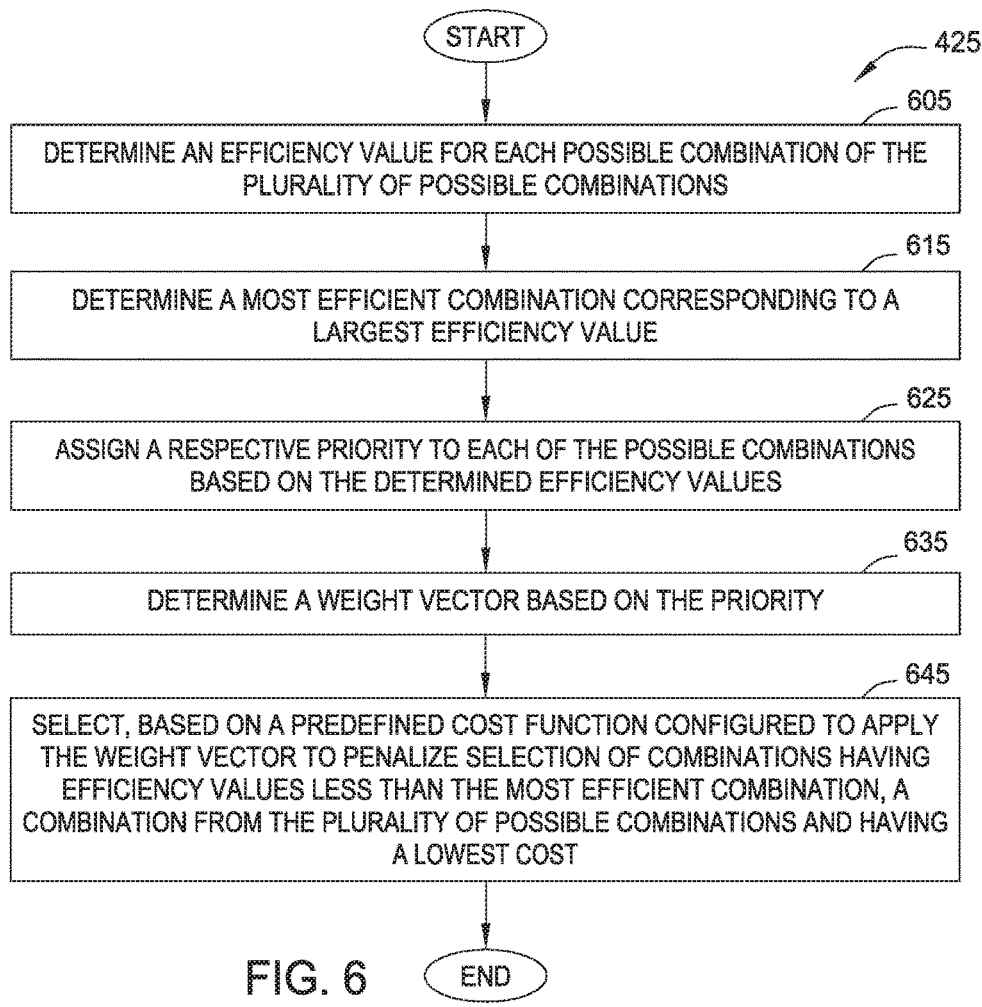
Figure 7:
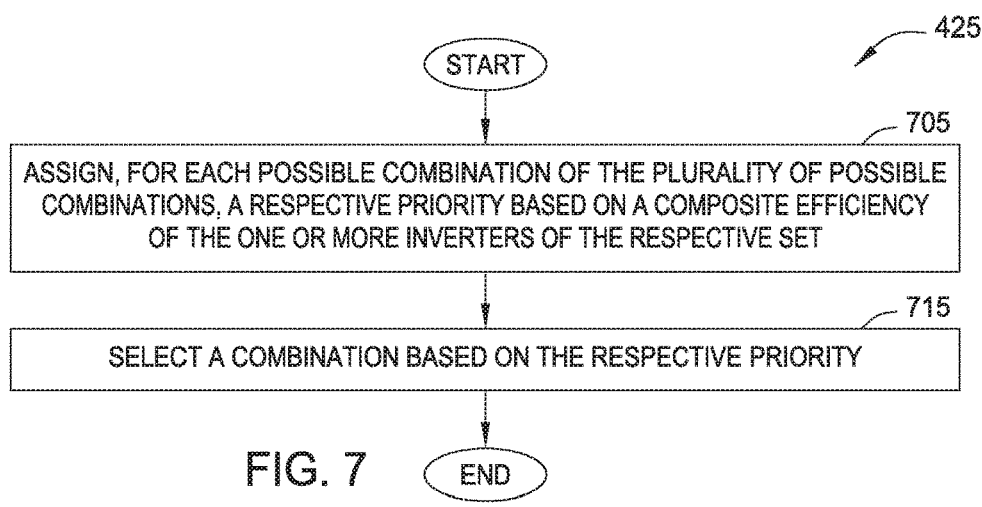

FIGS. 5, 6, and 7 illustrate exemplary methods of selecting a combination of inverters based on one or more predefined efficiency functions, according to various embodiments.

Figure 8:
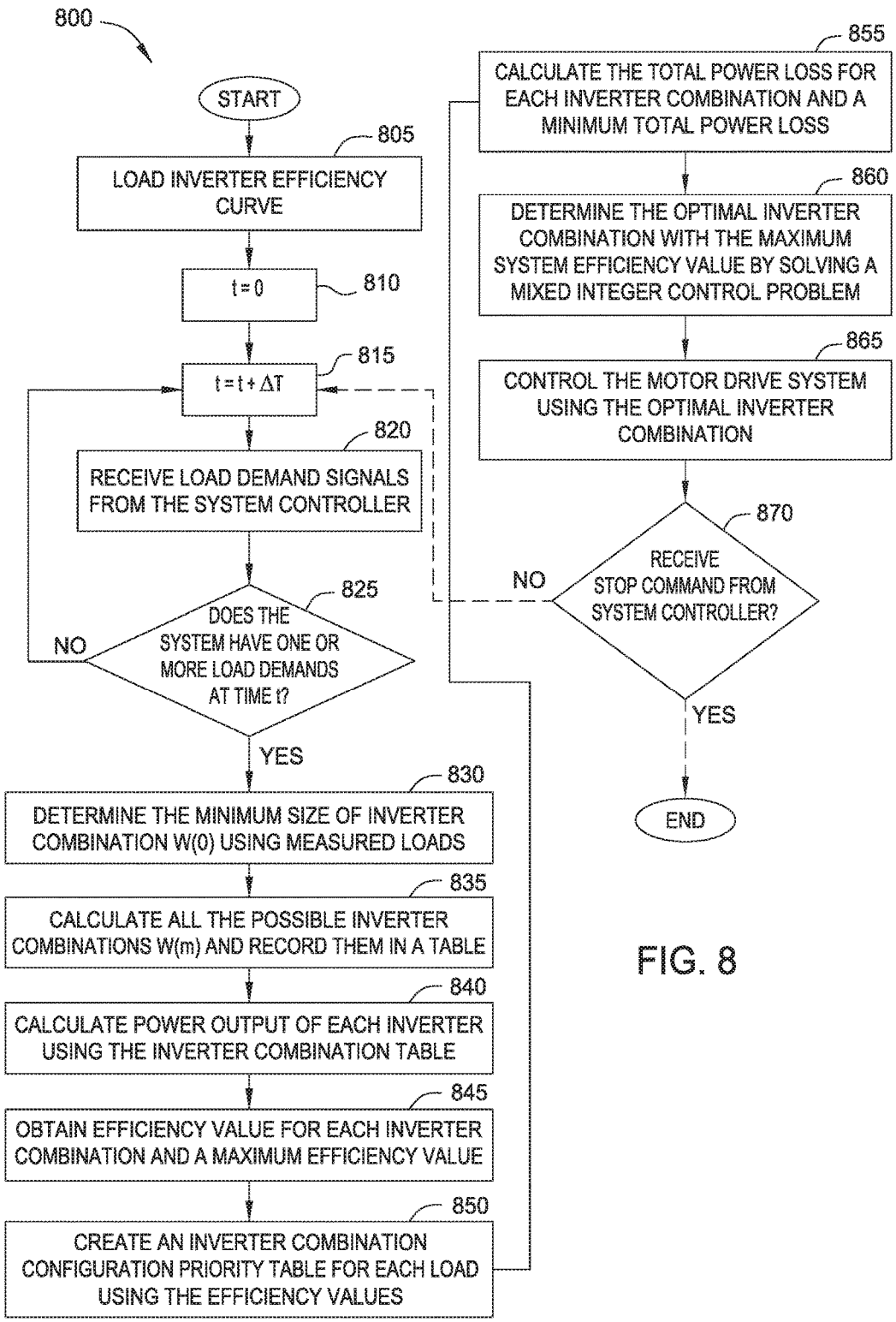

FIG. 8 illustrates an exemplary method of controlling power distribution from a plurality of inverters to one or more loads, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The illustrations referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

To improve the efficient use of a plurality of parallel inverters within a modular converter arrangement to power one or more electrical loads, a controller selects a combination of inverters from a plurality of possible combinations based on one or more predefined efficiency functions associated with the plurality of parallel inverters. In some embodiments, the controller selects the combination based on determined total power loss values for each of the plurality of possible combinations. In some embodiments, the controller selects the combination based on determined (composite) efficiency values for each of the plurality of possible combinations. In some embodiments, the plurality of possible combinations are ranked by the determined efficiency values and assigned a relative priority. In some embodiments, the controller selects the combination according to a predefined cost function that considers the determined efficiency values, total power loss values, and/or the assigned relative priority.

In some embodiments, the controller is configured to dynamically update the selected combination of inverters based on a change in power production capability of at least one inverter of the set of one or more inverters corresponding to the selected combination and/or a change in the load demands of the one or more loads. In this way, the modular converter arrangement is generally able to increase the utilization of motor controllers and other electrical loads, which can result in a reduced weight and cost of the overall system.

Figure 1:
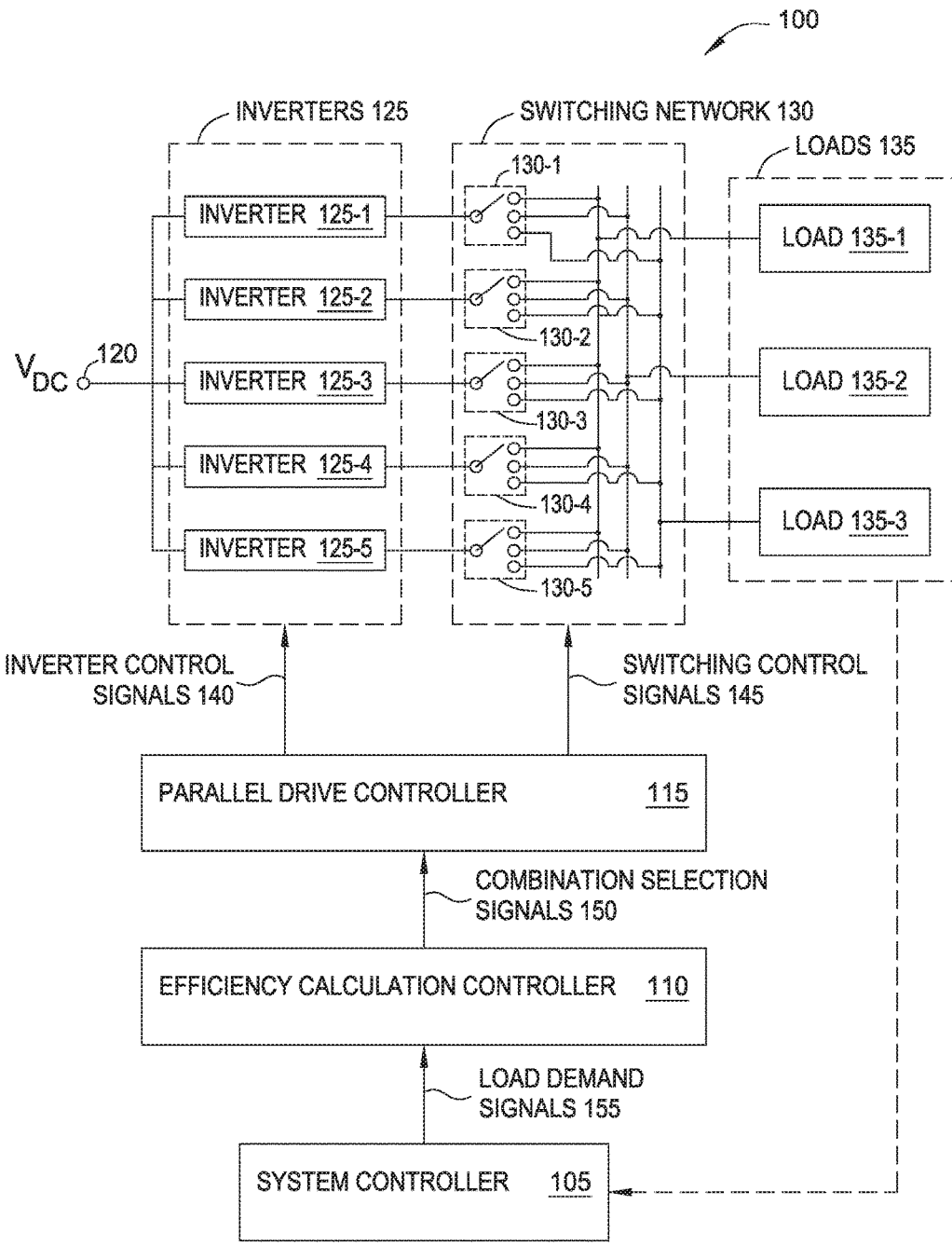

Referring to FIG. 1, a modular converter system 100 controls a plurality of inverters 125 arranged in parallel and that are configured to drive one or more electrical loads 135. The inverters 125 may comprise, for example and not limitation, any of insulated-gate bipolar transistors (IGBTs), metal-oxide-semiconductor field-effect transistors (MOSFETs), and bipolar junction transistors (BJTs). The electrical loads 135 may comprise multiple and/or different types of alternating current (AC) or direct current (DC) machines, such as electrical motors. As shown, the plurality of inverters 125 comprises five (5) inverters 125-1, 125-2, 125-3, 125-4, 125-5 and the one or more electrical loads 135 comprises three (3) loads 135-1, 135-2, 135-3, but different implementations may include different numbers of inverters 125 and/or electrical loads 135.

Each inverter 125 receives an input power signal (represented as a DC voltage $V_{DC}$) at an input node 120 that is common to the plurality of inverters 125. Other implementations may include a plurality of different input signals (e.g., DC voltages having different magnitudes) provided to selected inverters 125. Each inverter 125 generates a requested AC power output (e.g., having a requested voltage level, frequency, waveform, etc.) based on the received input signal and based on inverter control signals 140 provided by a parallel drive controller 115. In some embodiments, each of the plurality of inverters 125 is substantially the same (e.g., a same model having substantially identical electrical ratings and/or other electrical characteristics). In other embodiments, the plurality of inverters 125 comprises at least two differing inverters 125.

Generally, each electrical load 135 may be powered using a selected one or more of the plurality of inverters 125. In some embodiments, the one or more inverters 125 are selected using switching control signals 145 that are generated by the parallel drive controller 115 and applied to a dynamically reconfigurable switching network 130 arranged between the inverters 125 and the electrical loads 135. The switching network 130 can be implemented using any suitable switching elements, depicted as power switches 130-1, 130-2, 130-3, 130-4, 130-5. Some non-limiting examples of power switches 130-1, 130-2, 130-3, 130-4, 130-5 include solid state relays, mechanical relays, transistors, and other controllable power switches. The parallel drive controller 115 controls the operation of each power switch 130-1, 130-2, 130-3, 130-4, 130-5 using switching control signals 145 applied to the switching network 130. While five (5) power switches 130-1, 130-2, 130-3, 130-4, 130-5 corresponding to the five (5) inverters 125 are depicted, different implementations may include different numbers of power switches within the switching network 130. Further, in some embodiments the switching network 130 is operated as a short circuit and/or over-current protection device. For example, the switching elements that are associated with the short-circuited or over-current load are configured to open when a fault is detected.

In some embodiments, the parallel drive controller 115 is configured to dynamically reconfigure the switching network 130 to provide in real-time an appropriate number of inverters 125 in parallel to drive an electrical load 135. In other words, when the power demand for a particular electrical load 135 increases, the parallel drive controller 115 may transmit updated switching control signals 145 that cause the switching network 130 to place additional inverters 125 in parallel to meet the increased power demand. Conversely, when the power demand of an electrical load 135 decreases, the parallel drive controller 115 may transmit updated switching control signals 145 that cause the switching network 130 to disengage one or more inverters 125. The parallel drive controller 115 may subsequently place the disengaged inverters 125 in parallel with other inverters 125 to drive other electrical loads 135. In some cases, the parallel drive controller 115 may transmit updated switching control signals 145 based on a determined change in power production capability of at least one inverter. For example, due to deterioration or due to occurrence fault, the power production capability of a first inverter 125 may be reduced or eliminated (i.e., rendered non-functional). The parallel drive controller 115 may responsively augment or replace the first inverter 125 with a second inverter 125 having suitable power production capability based on the power demands of the electrical load 135. Conversely, when the power production capability of a first inverter 125 is increased, the parallel drive controller 115 may disengage a second inverter 125.

In some embodiments, the parallel drive controller 115 is stored and run on an embedded controller. The parallel drive controller 115 may comprise, for example and not limitation, a microcontroller, processor, field-programmable gate array (FPGA), or application-specific integrated circuit (ASIC). In some embodiments, the parallel drive controller 115 uses a real-time simulator/emulator or is run in real-time.

The parallel drive converter 115 is configured to provide the inverter control signals 140 according to one or more predetermined algorithms. The inverters 125 generally provide feedback signals, such as current and/or voltage values, to the parallel drive controller 115, which are applied to the selected algorithm(s). In the case where one or more of the loads 135 comprise electrical motors, the parallel drive converter 115 selects appropriate motor control algorithm(s) for generating the inverter control signals 140. Some non-limiting examples of motor control algorithms include field-oriented control (FOC), direct torque control (DTC), and voltage over frequency control (V/F). Different motor control algorithms can be useful to efficiently drive the various motor types of an associated vehicle (e.g., induction motors, synchronous motors, permanent magnet (PM) synchronous motors, brushless DC motors, etc.). For example, a typical aircraft can include a starter motor-generator for the main engines (a PM-type motor), a ram-air fan (induction motor), an environmental control system (ECS) compressor motor (PM-type motor), and one or more synchronous motors, all of which may have different power requirements.

Although not depicted, the modular converter system 100 may further include a software-based or hardware-based control switching network that is configured to apply a selected algorithm of a plurality of predetermined algorithms to one or more selected inverters 125. The control switching network may be included within the parallel drive controller 115 or separately implemented.

In some embodiments, the modular converter system 100 comprises an efficiency calculation controller 110 that is configured to select a particular combination of the inverters 125 based on efficiency information associated with the inverters 125. In some embodiments, the efficiency calculation controller 110 is included within the parallel drive controller 115. In other embodiments, the efficiency calculation controller 110 is included in a separate integrated circuit (IC). The system controller 105 is configured to communicate with external device(s), such as a vehicle controller, to obtain operational commands from the vehicle controller and to provide operational feedback signals (e.g., status signals) and/or other information to the vehicle controller. As shown, the efficiency calculation controller 110 receives one or more load requests (i.e., load demand signals 155) from a system controller 105, and selects a relatively efficient combination of the inverters 125 to meet the load requests. The efficiency calculation controller 110 transmits combination selection signals 150 to the parallel drive controller 115, which influence the switching control signals 145 and/or the inverter control signals 140 generated by the parallel drive controller 115. In some embodiments, the combination selection signals 150 include only combination information (that is, which of the plurality of inverters 125 are included in a selected combination to power a particular electrical load 135). In this case, the parallel drive controller 115 may determine how to distribute the loading among the inverters 125 of the selected combination. For example, the parallel drive converter 115 may distribute the loading equally among the selected inverters 125. In other embodiments, the combination selection signals 150 may include additional information, such as a power distribution between the inverters 125 of the selected combination.

Figure 2:
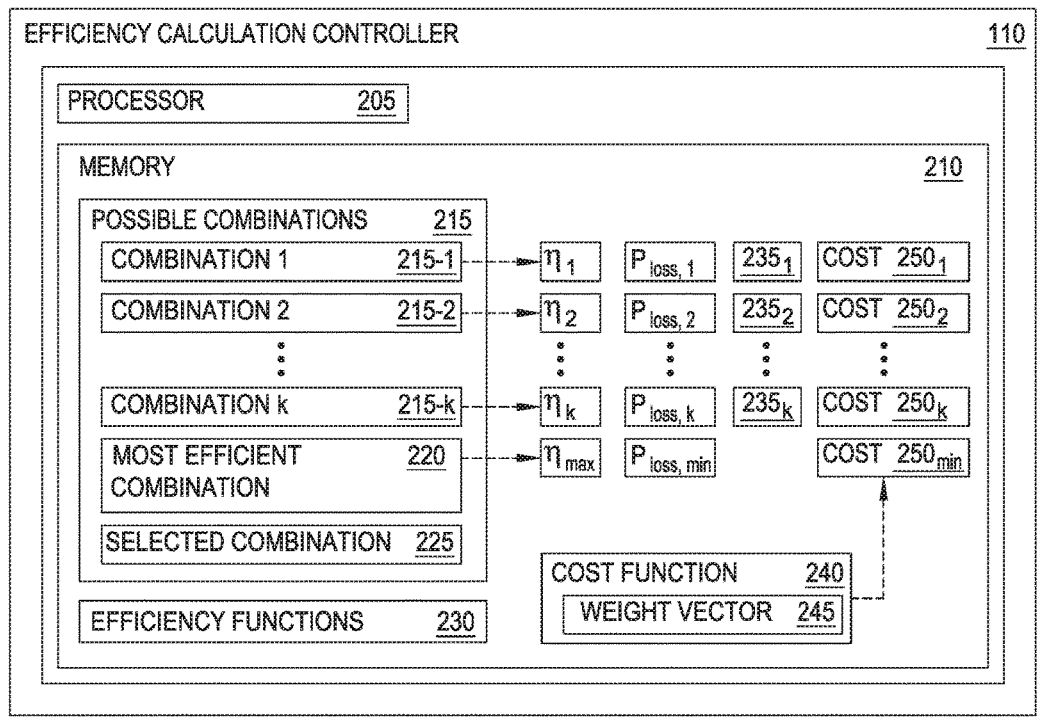
FIG. 2 is a block diagram of an exemplary efficiency calculation controller for a modular converter system, according to one embodiment.

One exemplary implementation of the efficiency calculation controller 110 is depicted in FIG. 2. The efficiency calculation controller 110 comprises a processor 205 and a memory 210. The processor 205 generally includes any processing element capable of performing various functions described herein. While depicted as a single element within the efficiency calculation controller 110, processor 205 is intended to represent a single processor, multiple processors, a processor or processors having multiple cores, as well as combinations thereof. Memory 210 may include a variety of computer-readable media selected for relative performance or other capabilities: volatile and/or non-volatile media, removable and/or non-removable media, etc. Memory 210 may include cache, random access memory (RAM), storage, etc. Storage included in the memory 110 typically provides a non-volatile memory for the efficiency calculation controller 110, and may include one or more different storage elements such as Flash memory, a hard disk drive, a solid state drive, an optical storage device, and/or a magnetic storage device.

The efficiency calculation converter 110 is configured to determine a plurality of possible combinations 215 (combination 215-1, 215-2, . . . , 215-*k*) of the inverters for meeting load demands corresponding to one or more electrical loads. In some embodiments, the efficiency calculation converter 110 determines, for a particular load request corresponding to an electrical load, a minimum number of inverters needed to meet the power requirement of the electrical load. The plurality of possible combinations 215 may include at least one combination that includes more inverters than the determined minimum number.

In some embodiments, each of the possible combinations 215 represents an assignment of particular inverters to power the one or more electrical loads without specifying the amount of power to be produced by each individual inverter. In one non-limiting example, a first combination assigns inverters 125-1, 125-2 to power electrical load 135-1, assigns inverter 125-3 to power electrical load 135-2, and assigns inverter 125-4 to power electrical load 135-3. Inverter 125-5 remains unassigned within the first combination and is available for dynamic load requirements. In some embodiments, each possible combination 215 assumes a predefined loading distribution of the inverters included therein. For example, the possible combination 215 may assume an equal loading of each inverter within the possible combination 215 (that is, dividing the amount of the power demand equally).

In other embodiments, each of the possible combinations 215 represents an assignment of particular inverters and an associated load distribution. For example, a first combination may specify three inverters (125-1, 125-2, 125-3) to power an electrical load according to a first load distribution (e.g., each inverter is assigned $\frac{1}{3}$ of the power demand), and a second combination may specify the same three inverters with a second load distribution (e.g., 50% to inverter 125-1, 25% to inverter 125-2, and 25% to inverter 125-3). In some cases, the load distribution for the inverters of a particular possible combination 215 may be selected based on the relative efficiency of the inverters at different power production levels, different power ratings of the inverters, etc.

Figure 3:
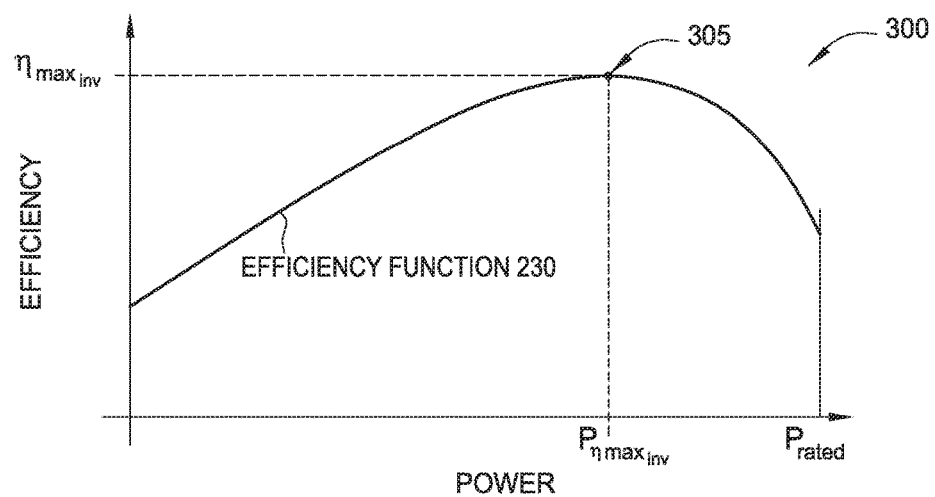
FIG. 3 is a graph illustrating an exemplary efficiency function of an inverter, according to one embodiment.

For each of the plurality of possible combinations 215 (i.e., combinations 215-1, 215-2, . . . , 215-$k$), the efficiency calculation controller 110 determines an efficiency value $\eta_1$, $\eta_2$, . . . , $\eta_k$ (that is, eta-sub1, eta-sub2, and so forth) associated with powering the one or more electrical loads using the combination 215-1, 215-2, . . . , 215-$k$. The efficiency values $\eta_1$, $\eta_2$, . . . , $\eta_k$ are determined based on one or more efficiency functions 230 associated with the operation of each of the inverters included in the particular possible combination 215-1, 215-2, . . . , 215-$k$. Generally, the efficiency functions 230 describe an efficiency of the inverter at a particular power production level. For example, an inverter may have different switching losses corresponding to different power production levels, affecting the overall efficiency of the inverter. An example efficiency function 230 is depicted in plot 300 of FIG. 3. In an ideal case, each inverter included in a particular combination will be operated at its respective maximum efficiency value $\eta_{max\_inv}$ (that is, eta-sub(max_inv)) at an operational point 305. At the maximum efficiency value $\eta_{max\_inv}$, the inverter produces a power level $P_{\eta max\_inv}$. However, it is possible that the power demanded by an electrical load (and which may dynamically change during operation) will not correspond to the power level $P_{\eta max\_inv}$, and one or more inverters of a particular combination are operated away from the maximum efficiency value $\eta_{max\_inv}$.

Returning to FIG. 2, in some embodiments the efficiency value $\eta_1$, $\eta_2$, . . . , $\eta_k$ represents a composite efficiency value—in other words, a combination of a plurality of efficiency values (from the efficiency functions 230) associated with the particular inverters. For example, if a particular possible combination 215 includes three electrically-identical inverters operated at a same power level (i.e., resulting in each inverter operating with a same efficiency value $\eta_{inv}$)(that is, eta-sub(inv)), the composite efficiency value of the combination would be the multiplicative product of the different efficiency values, or $(\eta_{inv})^3$. In other examples, the inverters may have different electrical properties and/or may be operated at different power levels, such that a determined composite efficiency value is calculated using more complex arithmetic functions (e.g., a weighted combination of the inverter efficiency values).

In some embodiments, the efficiency calculation controller 110 determines a most efficient combination 220 of the plurality of possible combinations 215, where the most efficient combination 220 corresponds to a maximum efficiency value $\eta_{max}$ of the plurality of efficiency values $\eta_1$, $\eta_2$, . . . , $\eta_k$. In some cases, the most efficient combination 220 can be selected as the selected combination 225 for powering a particular electrical load, but this is not a requirement. For example, in the cases of maintenance, debugging, or any mandatory operation scenarios, the selected combination 225 may be less efficient than the most efficient combination 220. In some embodiments, one or more external systems, such as the Flight Control Management Systems, may be configured to override the selected combination 225.

In some embodiments, the efficiency calculation controller 110 determines a respective priority $235_1$, $235_2$, . . . , $235_k$ (that is, 235-sub1, 235-sub2, and so forth) for each possible combination of the plurality of possible combinations 215 based on the plurality of efficiency values $\eta_1$, $\eta_2$, . . . , $\eta_k$. For example, using the k possible combinations 215, the most efficient combination 220 may be assigned a greatest priority value (e.g., a priority value of 1), and a least efficient combination of the plurality of combinations 215 assigned a smallest priority value (e.g., a priority value of k). In some embodiments, the relative priority values for different possible combinations 215 are considered when selecting the selected combination 225 according to a predefined cost function 240. For example, selecting one of the possible combinations 215 that is not the most efficient combination 220 may be penalized by applying the priority values to a predefined weight vector 245 included within the predefined cost function 240.

Further, in some embodiments, the efficiency calculation controller 110 determines a power loss value $P_{loss,\ 1}$, $P_{loss,\ 2}$, . . . , $P_{loss,\ k}$ (that is, P-sub(loss, 1), P-sub(loss-2), and so forth) for each possible combination of the plurality of possible combinations 215. The power loss value $P_{loss,\ 1}$, $P_{loss,\ 2}$, . . . , $P_{loss,\ k}$ may be based on the plurality of efficiency values $\eta_1$, $\eta_2$, . . . , $\eta_k$. For the most efficient combination 220, a minimum power loss value $P_{loss,\ min}$ (that is P-sub(loss, min)) is determined by the efficiency calculation controller 110. In some embodiments, the predefined cost function 240 considers a difference between the power loss value $P_{loss,\ 1}$, $P_{loss,\ 2}$, . . . , $P_{loss,\ k}$ and the minimum power loss value $P_{loss,\ min}$ when selecting the selected combination 225. In one non-limiting example, the predefined cost function 240 comprises a mixed integer quadratic function that considers the predefined weight vector 245 as a first-order term and a sum of squared power loss differences as a second-order term. An example of a mixed integer quadratic function as the predefined cost function 240 is discussed in greater detail with respect to FIG. 8 below. In other embodiments, the predefined cost function 240 may be any suitable function based on one or more of the efficiency values $\eta_1$, $\eta_2$, . . . , $\eta_k$, power loss values $P_{loss,\ 1}$, $P_{loss,\ 2}$, . . . , $P_{loss,\ k}$, and the priorities $235_1$-$235_k$.

In some embodiments, the efficiency calculation controller 110 applies the predefined cost function 240 to determine a cost value $250_1$, $250_2$, . . . , $250_k$ for each possible combination of the plurality of possible combinations 215. In this case, the efficiency calculation controller 110 determines which of the cost values $250_1$, $250_2$, . . . , $250_k$ corresponds to a minimum cost value $250_{min}$, and selects the possible combination 215 corresponding to the minimum cost value $250_{min}$. The selected combination 225 having the minimum cost value $250_{min}$ can correspond to the most efficient combination 220, but this is not a requirement.

Figure 4:
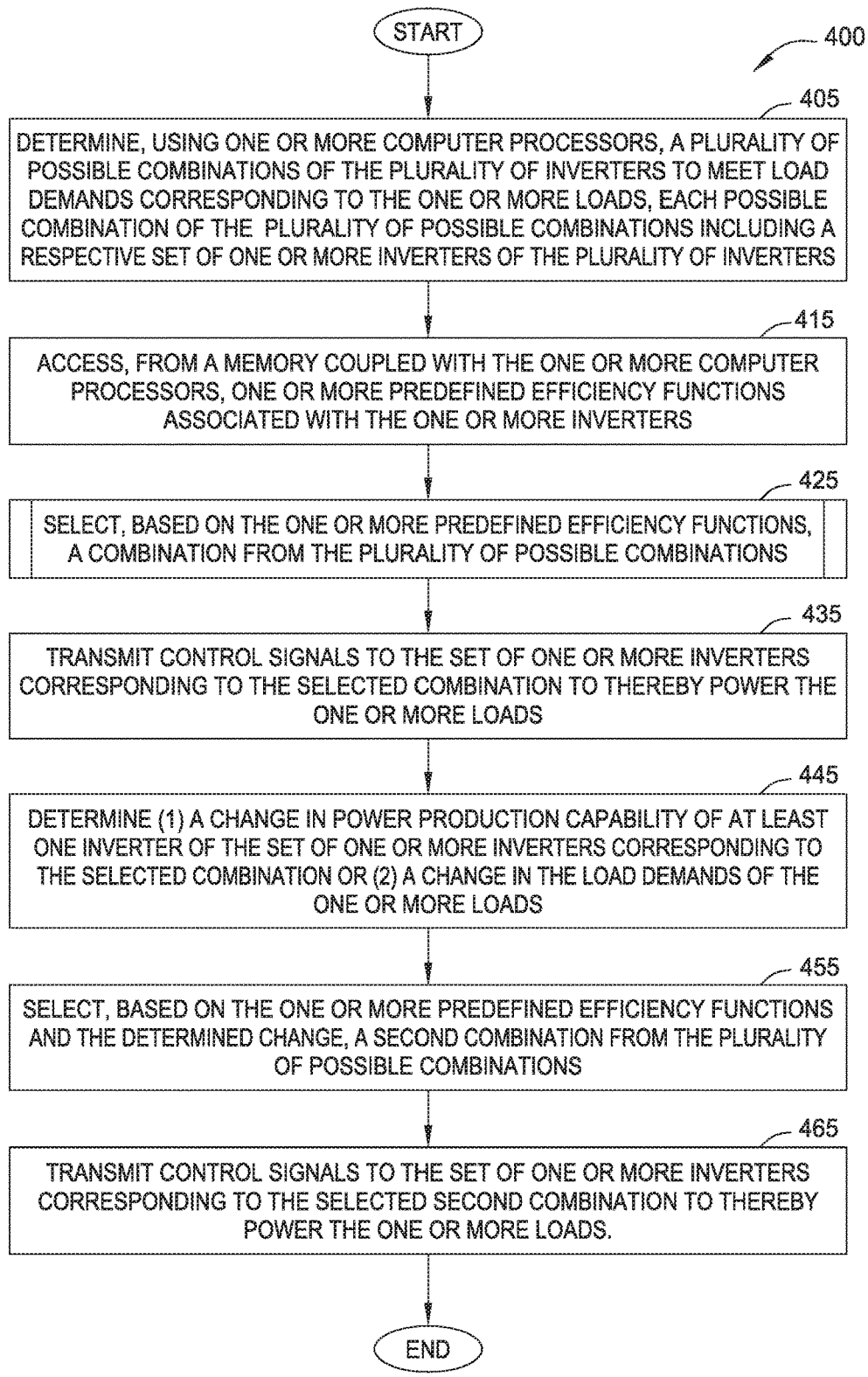
FIG. 4 illustrates an exemplary method of controlling power distribution from a plurality of inverters to one or more loads, according to one embodiment.

FIG. 4 illustrates an exemplary method 400 of controlling power distribution from a plurality of inverters to one or more electrical loads, according to one embodiment. The method 400 is generally performed by one or more computer processors of one or more controllers, such as the parallel drive controller or efficiency calculation controller described with respect to FIG. 1. Method 400 begins at block 405, where one or more computer processors are used to determine a plurality of possible combinations of the plurality of inverters to meet load demands corresponding to the one or more loads. Each possible combination of the plurality of combination of the plurality of possible combinations including a respective set of one or more inverters of the plurality of inverters.

At block 415, one or more predefined efficiency functions associated with the one or more inverters are accessed from a memory coupled with the one or more computer processors. In some cases, each of the plurality of inverters has substantially identical electrical ratings and/or other electrical characteristics, such that a single efficiency function corresponds to the operation of each of the plurality of inverters.

At block 425, the one or more computer processors select, based on the one or more predefined efficiency functions, a combination from the plurality of combinations. At block 435, the one or more computer processors transmit control signals to the set of one or more inverters corresponding to the selected combination to thereby power the one or more loads.

At block 445, the one or more computer processors determine (1) a change in power production capability of at least one inverter of the set of one or more inverters corresponding to the selected combination, or (2) a change in the load demands of the one or more loads.

At block 455, the one or more computer processors select, based on the one or more predefined efficiency functions and the determined change, a second combination from the plurality of possible combinations. At block 465, the one or more computer processors transmit control signals to the set of one or more inverters corresponding to the selected second combination to thereby power the one or more loads. In some embodiments, the set corresponding to the first combination differs from the set corresponding to the second combination by at least one inverter. Method 400 ends following completion of block 465.

FIGS. 5, 6, and 7 illustrate exemplary methods of selecting a combination of inverters based on one or more predefined efficiency functions, according to various embodiments. For example, the methods shown in each of FIGS. 5, 6, and 7 may correspond to block 425 of method 400 discussed above.

The method of FIG. 5 begins at block 505, where the one or more processors calculate, based on the one or more predefined efficiency functions, a maximum efficiency value corresponding to the plurality of possible combinations. At block 515, the one or more processors calculate a minimum power loss value corresponding to the maximum efficiency value. At block 525, the one or more processors calculate, for each possible combination of the plurality of combinations and based on the one or more predefined efficiency functions, a respective power loss value for the possible combination. At block 535, the one or more processors apply the respective power loss value to a cost function. In some embodiments, applying the respective power loss value comprises determining the cost function based on a different between the power loss value and the minimum power loss value. At block 545, the one or more processors select, based on the respective power loss value applied to the cost function, a combination from the plurality of possible combination and having a lowest cost. The method of FIG. 5 ends following completion of block 545.

The method of FIG. 6 begins at block 605, where the one or more processors determine an efficiency value for each possible combination of the plurality of possible combinations. At block 615, the one or more processors determine a most efficient combination corresponding to a largest efficiency value. At block 625, the one or more processors assign a respective priority to each of the possible combinations based on the determined efficiency values. At block 635, the one or more processors determine a weight vector based on the priority. At block 645, the one or more processors select, based on a predefined cost function configure to apply the weight vector to penalize selection of combinations having efficiency values less than the most efficient combination, a combination from the plurality of possible combinations and having a lowest cost. The method of FIG. 6 ends following completion of block 645.

The method of FIG. 7 begins at block 705, where the one or more processors assign, for each possible combination of the plurality of possible combinations, a respective priority based on a composite efficiency of the one or more inverters of the respective set. At block 715, the one or more processors select a combination based on the respective priority. The method of FIG. 7 ends following completion of block 715.

FIG. 8 illustrates an exemplary method 800 of controlling power distribution from a plurality of inverters to one or more loads, according to one embodiment. Generally, the method 800 may be performed by one or more controllers in conjunction with one or more embodiments discussed herein. For example, the method 800 provides one non-limiting example of method 400 discussed above with respect to FIG. 4. Further, method 800 uses an example configuration of five (5) inverters and three (3) loads ("Load-1," "Load-2," and "Load-3") as shown in FIG. 1, although different numbers are also possible.

Method 800 begins at block 805, where the one or more controllers load an inverter efficiency curve. The inverter efficiency curve generally corresponds to the predefined efficiency function discussed above. At block 810, the one or more controller sets a time variable (t) equal to zero. At block 815, the time variable t is updated with ΔT.

At block 820, the one or more controllers receive load demand signals, described as load demand signals $P_{Load-1}(t)$, $P_{Load-2}(t)$, and $P_{Load-3}(t)$, from a system controller. At block 825, the one or more controllers determine whether the system has one or more load demands at time t. If the load demand signals $P_{Load-1}(t)$, $P_{Load-2}(t)$, and $P_{Load-3}(t)$ are zero (indicating a no-load condition) ("NO" branch), the one or more controllers return to block 815 and waits for the next load demand information. If any of the load demand signals $P_{Load-1}(t)$, $P_{Load-2}(t)$, and $P_{Load-3}(t)$ are non-zero ("YES" branch), the method proceeds to block 830.

Within this example, each "Inverter Combination" represents one or more inverters that are combined together in parallel to drive a particular load. More specifically, Inverter Combination-1 drives Load-1, Inverter Combination-2 drives Load-2, and Inverter Combination-3 drives Load-3. Because the power demand of each load can vary as a function of time, the number of inverters included within each Inverter Combination can be dynamically changed (i.e., increased and/or decreased) in order to meet the varied power demands. Using Load-1 and Inverter Combination-1 as an example, at one time instant, there may be only one (1) inverter in Inverter Combination-1 because power demand of Load-1 is relatively small. At another time instant, Inverter-Combination-1 may include five (5) inverters in parallel because the power demand of Load-1 is very high. At yet another time instant, Inverter Combination-1 may include zero (0) inverters as the power demand of Load-1 is zero.

An example set of variables used to select inverter combinations according to method 800 is provided in Table 1, and an example set of constraints in Table 2.

TABLE 1

Example variables

| | |
|---|---|
| $N1(t), N2(t), N3(t)$ | The respective count of inverters included in Inverter Combination-1, -2, -3. |
| $P_{MaxLoads} = P_{Max\_Load-1} + P_{Max\_Load-2} + P_{Max\_Load-3}$ | |
| $P_{RatedPower\_Inv}$ | Rated power of each inverter. |
| $P_{Inv\_array\_RatedPower} = 5 \times P_{RatedPower\_Inv}$ | |
| $P_{Inv\_combin-1, 2, 3\_RatedPower}$ | Rated power of Inverter Combination-1, -2, or -3. For example, $P_{Inv\_combin-1\_RatedPower} = N1(t) \times P_{RatedPower\_Inv}$ |
| $P_{Load-1, 2, 3}(t)$ | Instantaneous power demand at time t for Load-1, -2, or -3. |
| $P_{Inv-1, 2, 3, 4, 5}(t)$ | Instantaneous power production at time t for Inverter-1, -2, -3, -4, or -5. |
| $P_{Inv\_combin-1, 2, 3}(t)$ | Instantaneous power production at time t for Inverter Combination-1, -2, or -3. |
| $\eta_{Inv\_max}$ | Maximum efficiency point of inverter. |
| $\eta_{Inv\_combin-1, 2, 3}(t)$ | (Composite) Efficiency value at time t for Inverter Combination-1, -2, or -3. |

TABLE 2

Example constraints $P_{MaxLoads} <= P_{Inv\_array\_RatedPower}$
$P_{Load-1}(t) <= P_{Inv\_combin-1\_RatedPower}$
$P_{Load-2}(t) <= P_{Inv\_combin-2\_RatedPower}$
$P_{Load-3}(t) <= P_{Inv\_combin-3\_RatedPower}$
$P_{Load-1}(t) = P_{Inv\_combin-1}(t) \times \eta_{Inv\_combin-1}(t)$
$P_{Load-2}(t) = P_{Inv\_combin-2}(t) \times \eta_{Inv\_combin-2}(t)$
$P_{Load-3}(t) = P_{Inv\_combin-3}(t) \times \eta_{Inv\_combin-3}(t)$
$0 <= N1(t) <= 5; 0 <= N2(t) <= 5; 0 <= N3(t) <= 5;$ and $N1(t) + N2(t) + N3(t) <= 5$.
The number 3 is equal to the total number of loads; the number 5 is equal to the total number of inverters in parallel.
$\eta_{Inv\_combin-1}(t)$, $\eta_{Inv\_combin-2}(t)$, and $\eta_{Inv\_combin-3}(t)$ are defined as the efficiency of the Inverter Combination-1, -2, and -3 for Load-1, -2, and -3.
Assuming that the efficiency curve of all inverters are equal, $\eta_{Inv\_combin-1}(t) = \eta_{Inv\_combin-2}(t) = \eta_{Inv\_combin-3}(t) = \eta_{Inv}(t)$.

At block 830, the one or more controllers determine the minimum size for each Inverter Combination count: N1(t), N2(t), and N3(t) in Inverter Combination-1, -2, and -3 according to the power demands from Load-1, -2, and -3. An example set of steps for determining the minimum size is provided in Table 3.

TABLE 3

Example steps for determining minimum size of Inverter Combination $N1(t) = \text{ceil}(P_{Load-1}(t) / P_{RatedPower\_Inv})$, where "ceil(x)" is the match function that rounds each element of x to the nearest integer greater than or equal to that element.
$N2(t) = \text{ceil}(P_{load-2}(t) / P_{RatedPower\_Inv})$
$N3(t) = \text{ceil}(P_{load-3}(t) / P_{RatedPower\_Inv})$
Then the minimum size of Inverter Combination is represented as: $W(0) = [N1(t); N2(t); N3(t)]$
$U = N1(t) + N2(t) + N3(t)$, where U is the minimum count of inverters used to drive the loads
Let $V = 5 - U$, where V is the count of inverters remained (not used in W(0)), but available for use
Set m = 0, 1, 2... V.
For a general case, $Y \in \{0, 1, 2, 3 ... (Q - 1)\}$, where Q is the total number of load(s) and Y is the count of load(s) that are in a no-load condition. When Y equals 0, it means all the load(s) Q are demanding power at time t.

At block 835, the one or more controllers calculate all the possible inverter combinations W(m) and record them in a table. The one or more controllers may further determine a count of load(s) that are in a no-load condition. An example set of steps for determining the minimum size is provided in Table 4, an example set of steps for recording the assignments is provided in Table 5, and an example set of assignments is provided in Table 6.

TABLE 4

Example steps for calculating possible inverter combinations

When total Q loads are no load condition at time instant t where Q = Y, there is only one possible combination assignment:
m ∈ {0}; W(0) = 1; N1(t), N2(t), N3(t) . . . NQ (t) = 0
When there are one or more load demands at time instant t:
m = 0, 1, 2, 3 . . . V; Y ∈ {0, 1, 2, 3 . . . (Q − 1)};

$$W(m) = \text{Combination} (m + Q - 1 - Y, Q - 1 - Y) = \frac{(m + Q - 1 - Y)!}{m!(Q - 1 - Y)!}$$

TABLE 5

Example steps for recording assignments

For example, assume N1(t) = 2, N2(t) = 1, N3(t) = 0. This means that Load-1 requires two (2) inverters, Load-2 requires one (1) inverter, and Load-3 is no load condition.
Then the minimum number of inverter used to satisfy load demands U, is equal to 3.
The remaining inverters that are not used (V) is equal to 2, and m = 0, 1, and 2.
Load-3 is in a no-load condition and thus the count of load(s) that has no load condition Y, is equal to 1.
The total W(m) will be calculated as follows:

$$m = 0, 1, \& 2; Y \in \{1\}; Q \in \{3\}; W(m) = \text{Combination} (m + 1, 1) = \frac{(m + 1)!}{(m! \times 1!)}$$

Therefore, W(1) = 2, and W(2) = 3.

TABLE 6

Example assignments for W(m = 0, m = 1, m = 2)

| Total Combination Count | Inverter Combination | N1 (Number of inverters to drive Load-1) | N2 (Number of inverters to drive Load-2) | N3 (Number of inverters to drive Load-3) |
| --- | --- | --- | --- | --- |
| 1 | W(0) | 2 | 1 | 0 |
| 2 | W(1) | 3 | 1 | 0 |
| 3 |      | 2 | 2 | 0 |
| 4 | W(2) | 3 | 2 | 0 |
| 5 |      | 4 | 1 | 0 |
| 6 |      | 2 | 3 | 0 |

At block 840, the one or more controllers calculate the power output for each inverter according to the possible inverter combinations determined in Table 6. An example set of equations used to calculate the power output is provided in Table 7.

TABLE 7

Example equations for calculating power output $P_{Each\_Inv\_output\_combin-1} = P_{Load-1} \div N1(t)$
$P_{Each\_Inv\_output\_combin-2} = P_{Load-2} \div N2(t)$
$P_{Each\_Inv\_output\_combin-3} = P_{Load-3} \div N3(t)$ At block 845, the one or more controllers obtain efficiency value(s) $\eta_{Inv\_combin-1,2,3}$ and maximum efficiency value $\eta_{Inv\_Max}$ using the loaded inverter efficiency curve. An example set of equations used to obtain the different efficiency values is provided in Table 8.

TABLE 8

Example equations for obtaining efficiency values $\eta_{Inv\_combin-1, 2, 3} = \text{Efficiency\_Curve}(P_{Each\_Inv\_output\_combin-1,2,3})$
$\eta_{Inv\_Max} = \text{Max}(\text{Efficiency Curve})$ At block 850, the one or more controllers create an inverter combination configuration priority table to rank every Inverter Combination for Load-1, -2, and -3 in a priority order such that for each load, the Inverter Combination with the higher efficiency value has a higher priority order. A higher priority suggests that the Inverter Combination will result in a higher system efficiency and therefore should be implemented first.

For each load, the Inverter Combination with the maximum efficiency value is the most ideal and it will have the highest priority number. On the other hand, the Inverter Combination with the minimum efficiency value in each load is the least ideal and it will have the lowest priority number. If more than one Inverter Combinations in each load have the same efficiency value, the one or more controllers assign these inverter combinations to the same order of priority number.

If Load-n is a no load condition, then no inverter is being used and its efficiency value $\eta_{Inv\_combin-n}$ is zero. In this special case, the priority number should be constant for every Inverter Combination because this load has no weight factor to determine the optimal inverter combination (in block 860).

At block 855, the one or more controllers calculate a total power loss for every Inverter Combination described in Table 6, and also calculate a minimum total power loss. An example set of equations used to calculate total power loss and minimum total power loss is provided in Table 9.

TABLE 9

Example equations for calculating total power loss $$P_{Loss} = \frac{P_{load_1}(t) \times (1 - \eta_{Inv\ Comb_1})}{\eta_{Inv\ Comb_1}} + \frac{P_{load_2}(t) \times (1 - \eta_{Inv\ Comb_2})}{\eta_{Inv\ Comb_2}} + \frac{P_{load_3}(t) \times (1 - \eta_{Inv\ Comb_3})}{\eta_{Inv\ Comb_3}}$$

$$P_{Loss\ Min} = \frac{P_{load_1}(t) \times (1 - \eta_{Inv\_Max})}{\eta_{Inv\_Max}} + \frac{P_{load_2}(t) \times (1 - \eta_{Inv\_Max})}{\eta_{Inv\_Max}} + \frac{P_{load_3}(t) \times (1 - \eta_{Inv\_Max})}{\eta_{Inv\_Max}}$$

At block 860, the one or more controllers determine an Inverter Combination with the maximum overall system efficiency by solving a mixed integer control problem. An example set of steps used to determine the Inverter Combination is provided in Table 10.

TABLE 10

Example steps for determining maximum efficiency Inverter Combination

Switching Constraints
1) Connection of each inverter j at load k:
   $C_{kj} \in \{0, 1\}; \forall_j = S_k; k = 1, 2, 3 \ldots N^l; j = 1, 2, 3 \ldots N^j$
   k = load
   j = inverter
   $N^l$ = last load in the parallel operating system
   $N^j$ = last inverter in the parallel operating system
2) Constraint of each inverter j can only be connected to one load at time instant t.

$$\sum_{k=1}^{N^l} C_{kj}(t) = 1$$

3) Connection of each inverter combination configuration i for load k.
   $C_{ki} \in \{0, 1\}; \forall_i \in S_k; k = 1, 2, 3 \ldots N^l$
   i = all the possible inverter combination for load k
4) Constraint based on inverter combination configuration priorities
   $C_{k1}(t) \leq C_{k2}(t) \leq C_{k3}(t) \ldots C_{kN_i}(t); \forall_k = 1, 2, 3 \ldots N^l$
   $N_i$ = last inverter combination for load k
   $N^l$ = last inverter combination configuration for load k The goal is to maximize overall system efficiency by minimizing total power loss on inverter(s) while at the same time satisfying load(s) demands through dynamically changing Inverter Combination-1, -2, and -3. The quadratic in least square term of the cost function penalizes the inverters for work outside its optimal power loss range. By formulating the control problem in a mixed integer quadratic program, we could then determine the optimal inverter combination which will have the least penalty cost.

$$\text{Cost Function: min} \sum_{t=t^*}^{t^*+H \times T_s} \left\{ \sum_{k=1}^{N^l} \alpha_k^T [1 - C_k(t)] + \sum_{j=1}^{N_j} (P_{Loss} - P_{Loss\ Min})^2 \right\}$$

$\alpha_k^T = [\gamma_{k1} \gamma_{k2} \gamma_{k3} \ldots \gamma_{kN_i}]$ $C_k(t) = [C_{k1}(t) C_{k2}(t) C_{k3}(t) \ldots C_{kN_i}(t)], C_k(t) \in \{0, 1\},$ $k = 1, 2, 3 \ldots N^l$ k = load $N^l$ = last load in the parallel operating system $N_j$ = last inverter combination count $t^*$ = time instant H = total time steps during the operation $T_s$ = sampling time $P_{Loss}$ = total power loss; $P_{Loss\ Min}$ = minimum total power loss $C_k$=a vector that describes the connection of each inverter combination for load k at time instant t*. If the value $C_{k1}(t)$ inside the vector $C_k(t)$ is 1, it means the first inverter combination is not connected to Load k. The same logic applies to $C_{k2}(t), C_{k3}, \ldots, C_{kN_i}(t)$.

$\alpha_k^T$=a weight vector to penalize the act of using inverter combinations outside its maximum efficiency value, which is based on the inverter combination priority list of block 850. For every Inverter Combination in each load, the higher the priority number, the lower the penalty cost.

At block 865, the one or more controllers control the motor drive system using the determined optimal inverter combination. At block 870, the one or more controllers determine whether a stop command has been received from the system controller. If not ("NO" branch), the method returns to block 815 to await further load demand signals from the system controller. If the stop command was received ("YES" branch), method 800 ends.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A method of controlling power distribution from a plurality of inverters to one or more loads, the method comprising:
    determining, using one or more computer processors, a plurality of possible combinations of the plurality of inverters to meet load demands corresponding to the one or more loads, each possible combination of the plurality of possible combinations including a respective set of one or more inverters of the plurality of inverters;
    accessing, from a memory coupled with the one or more computer processors, one or more predefined efficiency functions associated with the one or more inverters;
    selecting, based on the one or more predefined efficiency functions, a combination from the plurality of possible combinations; and
    transmitting control signals to the set of one or more inverters corresponding to the selected combination to thereby power the one or more loads.

2. The method of claim 1, wherein selecting a combination from the plurality of possible combinations comprises:
    calculating, for each possible combination of the plurality of possible combinations and based on the one or more predefined efficiency functions, a respective power loss value for the possible combination; and
    selecting, based on the respective power loss value applied to a predefined cost function, a combination from the plurality of possible combinations and having a lowest cost.

3. The method of claim 2, wherein the predefined cost function comprises a mixed integer quadratic function.

4. The method of claim 2, further comprising:
calculating, based on the one or more predefined efficiency functions, a maximum efficiency value corresponding to the plurality of possible combinations; and
calculating a minimum power loss value corresponding to the maximum efficiency value,
wherein the predefined cost function is based on a difference between the power loss value and the minimum power loss value.

5. The method of claim 1, wherein selecting a combination from the plurality of possible combinations comprises:
determining an efficiency value for each possible combination of the plurality of possible combinations;
determining a most efficient combination corresponding to a largest efficiency value; and
selecting, based on a predefined cost function configured to apply a weight vector to penalize selection of combinations having efficiency values less than the most efficient combination, a combination from the plurality of possible combinations and having a lowest cost.

6. The method of claim 5, further comprising:
assigning a respective priority to each of the possible combinations based on the determined efficiency values; and
determining the weight vector based on the priority.

7. The method of claim 1, further comprising:
determining (1) a change in power production capability of at least one inverter of the set of one or more inverters corresponding to the selected combination or (2) a change in the load demands of the one or more loads;
selecting, based on the one or more predefined efficiency functions and the determined change, a second combination from the plurality of possible combinations; and
transmitting control signals to the set of one or more inverters corresponding to the selected second combination to thereby power the one or more loads.

8. The method of claim 1, wherein selecting a combination from the plurality of possible combinations comprises:
assigning, for each possible combination of the plurality of possible combinations, a respective priority based on a composite efficiency of the one or more inverters of the respective set; and
selecting a combination based on the respective priority.

9. A power distribution system for powering one or more loads, the power distribution system comprising:
a plurality of inverters; and
a controller comprising one or more computer processors and configured to:
determine a plurality of possible combinations of the plurality of inverters to meet load demands corresponding to the one or more loads, each possible combination of the plurality of possible combinations including a respective set of one or more inverters of the plurality of inverters;
access, from a memory coupled with the one or more computer processors, one or more predefined efficiency functions associated with the one or more inverters;
select, based on the one or more predefined efficiency functions, a combination from the plurality of possible combinations; and
transmit control signals to the set of one or more inverters corresponding to the selected combination to thereby power the one or more loads.

10. The power distribution system of claim 9, wherein selecting a combination from the plurality of possible combinations comprises:
calculating, for each possible combination of the plurality of possible combinations and based on the one or more predefined efficiency functions, a respective power loss value for the possible combination; and
selecting, based on the respective power loss value applied to a predefined cost function, a combination from the plurality of possible combinations and having a lowest cost.

11. The power distribution system of claim 10, wherein the predefined cost function comprises a mixed integer quadratic function.

12. The power distribution system of claim 10, wherein the controller is further configured to:
calculate, based on the one or more predefined efficiency functions, a maximum efficiency value corresponding to the plurality of possible combinations; and
calculate a minimum power loss value corresponding to the maximum efficiency value,
wherein the predefined cost function is based on a difference between the power loss value and the minimum power loss value.

13. The power distribution system of claim 9, wherein selecting a combination from the plurality of possible combinations comprises:
determine an efficiency value for each possible combination of the plurality of possible combinations;
determine a most efficient combination corresponding to a largest efficiency value; and
select, based on a predefined cost function configured to apply a weight vector to penalize selection of combinations having efficiency values less than the most efficient combination, a combination from the plurality of possible combinations and having a lowest cost.

14. The power distribution system of claim 13, wherein the controller is further configured to:
assign a respective priority to each of the possible combinations based on the determined efficiency values; and
determine the weight vector based on the priority.

15. The power distribution system of claim 9, wherein the controller is further configured to:
determine (1) a change in power production capability of at least one inverter of the set of one or more inverters corresponding to the selected combination or (2) a change in the load demands of the one or more loads;
select, based on the one or more predefined efficiency functions and the determined change, a second combination from the plurality of possible combinations; and
transmit control signals to the set of one or more inverters corresponding to the selected second combination to thereby power the one or more loads.

16. The power distribution system of claim 9, wherein selecting a combination from the plurality of possible combinations comprises:
assigning, for each possible combination of the plurality of possible combinations, a respective priority based on a composite efficiency of the one or more inverters of the respective set; and
selecting a combination based on the respective priority.

17. A method of controlling power distribution from a plurality of inverters to one or more loads, the method comprising:
determining, using one or more computer processors, a plurality of possible combinations of the plurality of inverters to meet load demands corresponding to the one or more loads, each possible combination of the plurality of possible combinations including a respective set of one or more inverters of the plurality of inverters;

accessing, from a memory coupled with the one or more computer processors, one or more predefined efficiency functions associated with the one or more inverters;

assigning, for each possible combination of the plurality of possible combinations, a respective priority based on a composite efficiency of the one or more inverters of the respective set;

selecting a combination from the plurality of possible combinations based on the respective priority; and transmitting control signals to the set of one or more inverters corresponding to the selected combination to thereby power the one or more loads.

18. The method of claim 17, wherein the assigned priority is applied to a predefined cost function, and wherein selecting a combination from the plurality of possible combinations based on the respective priority comprises:

determining, for each possible combination of the plurality of possible combinations and based on the predefined cost function, a respective cost for the possible combination; and selecting a combination from the plurality of possible combinations and having a lowest cost.

19. The method of claim 17, further comprising:

determining a weight vector based on the assigned priority, wherein a predefined cost function applies the weight vector to penalize selection of combinations having efficiency values less than a most efficient combination having a largest composite efficiency.

20. The method of claim 17, further comprising:

determining (1) a change in power production capability of at least one inverter of the set of one or more inverters corresponding to the selected combination or (2) a change in the load demands of the one or more loads;

selecting, based on the one or more predefined efficiency functions and the determined change, a second combination from the plurality of possible combinations; and transmitting control signals to the set of one or more inverters corresponding to the selected second combination to thereby power the one or more loads.

* * * * *